US007309722B2

(12) United States Patent
Ogihara et al.

(10) Patent No.: US 7,309,722 B2
(45) Date of Patent: *Dec. 18, 2007

(54) COMPOSITION FOR FORMING POROUS FILM, POROUS FILM AND METHOD FOR FORMING THE SAME, INTERLEVEL INSULATOR FILM, AND SEMICONDUCTOR DEVICE

(75) Inventors: Tsutomu Ogihara, Niigata-ken (JP); Fujio Yagihashi, Niigata-ken (JP); Hideo Nakagawa, Kadoma (JP); Masaru Sasago, Kadoma (JP)

(73) Assignees: Shin-Etsu Chemical Co. Ltd., Tokyo (JP); Matsushita Electric Co., Ltd, Osaka (JP)

( * ) Notice: Subject to any disclaimer, the term of this patent is extended or adjusted under 35 U.S.C. 154(b) by 130 days.

This patent is subject to a terminal disclaimer.

(21) Appl. No.: 10/703,374

(22) Filed: Nov. 7, 2003

(65) Prior Publication Data
US 2004/0105986 A1 Jun. 3, 2004

(30) Foreign Application Priority Data
Nov. 13, 2002 (JP) ............................. 2002-329128

(51) Int. Cl.
*C09D 183/04* (2006.01)
*C08K 3/22* (2006.01)

(52) U.S. Cl. ................. 521/91; 521/110; 521/154; 257/40

(58) Field of Classification Search ................ 257/40; 438/99; 521/91, 110, 154; 157/40
See application file for complete search history.

(56) References Cited

U.S. PATENT DOCUMENTS

| 4,503,024 | A | * | 3/1985 | Bourgogne et al. ......... 423/709 |
| 6,084,096 | A | | 7/2000 | Li et al. |
| 6,248,682 | B1 | * | 6/2001 | Thompson et al. ............ 502/4 |
| 6,440,309 | B1 | | 8/2002 | Cohen |
| 6,685,889 | B1 | | 2/2004 | Raftery et al. |
| 6,794,544 | B2 | | 9/2004 | Babiak et al. |
| 2003/0151032 | A1 | | 8/2003 | Ito et al. |

FOREIGN PATENT DOCUMENTS

| JP | 9194298 | 7/1997 |
| JP | 2000044875 | 2/2000 |
| JP | 2000-143429 | 5/2000 |
| JP | 2001115029 | 4/2001 |
| JP | 2001130911 | 5/2001 |
| JP | 2001203197 | 7/2001 |
| WO | WO 92/20623 A1 | 11/1992 |
| WO | WO 02/0617765 A1 | 8/2002 |

OTHER PUBLICATIONS

Burkett, et al. "Mechanism of Structure Direction in the Synthesis of Si-ZSM-5: An Investigation by Intermolecular $_1$H-$^{29}$Si CP MAS NMR" *J. Phys. Chem.* 98:4647-4653 (1994).
Burkett, et al. "Mechanism of Structure Direction in the Synthesis of Pure-Silica Zeolites. 1. Synthesis of TPA/Si-ZSM-5" *Chem. Mater.* 7:920-928 (1995).
Burkett, et al. "Mechanism of Structure Direction in the Synthesis of Pure-Silica Zeolites. 2. Hydrophobic Hydration and Structural Specificity" *Chem. Mater.* 7:1453-1463 (1995).
Davis, et al. "Towards the Rational Design and Synthesis of Microporous and Mesoporous Silica-Containing Materials" *Zeolite* 12(2):33-47 (1995).
Huang, et al. "Fabrication of Ordered Porous Structures by Self-Assembly of Zeolite Nanocrystals" *J. Am. Chem. Soc.* 122:3530-3531 (2000).
Inagaki, et al. "Synthesis of Highly Ordered Mesoporous Materials from a Layered Polysilicate" *J. Chem. Soc., Chem. Commun.* p. 680-682 (1993).
Ono, et al. *Zeolite no Kagaku to Kougaku (The Science and Technology of Zeolite)* Published By: Koudansha Scientific, Co., Ltd. (Jul. 10, 2000) English translation of pp. 30-35.
Wang et al. "Colloidal Suspensions of Template-Removed Zeolite Nanocrystals" *Chem. Commun.* 2333-2334 (2000).
Wang, et al. "Pure-Silica Zeolite Low-*k* Dielectric Thin Films" *Advanced Materials* 13(10):746-749 (May 17, 2001).
Xu, et al. "A Novel Method for the Preparation of Zeolite ZSM-5" *J. Chem. Soc., Chem. Commun.* 755-756 (1990).
Lobo et al. (1995) "Structure-Direction in Zeolite Synthesis" *Journal of Inclusion Phenomena and Molecular Recognition in Chemistry* 21:47-78.
Lovallo et al. (1996) "Preferentially Oriented Submicron Silicate Membranes" *AIChE Journal* 42:2333-2334.

* cited by examiner

*Primary Examiner*—Irina S. Zemel
(74) *Attorney, Agent, or Firm*—Myers, Bigel, Sibley & Sajovec, P.A.

(57) ABSTRACT

The present invention provides a composition for film formation which can form a porous film that excels in dielectric properties, adhesion, film consistency and mechanical strength, and that is easily thinned; a porous film and a method for forming the same, and a high-performing and highly reliable semiconductor device which contains the porous film inside. More specifically, the composition for forming a porous film comprises a solution containing an amorphous polymer which is obtained by hydrolyzing and condensing at least one silane compound expressed by the general formula $(R^1)_n Si(OR^2)_{4-n}$, and a zeolite sol which is formed by using a quaternary ammonium hydroxide. The method for forming a porous film comprises a coating step for coating the composition for forming a porous film; a subsequent drying step; and a porousness forming step.

16 Claims, 1 Drawing Sheet

COMPOSITION FOR FORMING POROUS FILM, POROUS FILM AND METHOD FOR FORMING THE SAME, INTERLEVEL INSULATOR FILM, AND SEMICONDUCTOR DEVICE

RELATED APPLICATION

This application claims priority from Japanese Patent Application No. 2003-329128 filed Nov. 13, 2002, the disclosure of which is incorporated by reference herein in its entirety.

BACKGROUND OF THE INVENTION

1. Field of the Invention

The present invention relates to a composition for film formation which can be formed into a porous film that excels in dielectric properties, adhesion, film consistency and mechanical strength, and has reduced absorption; a porous film and a method for forming the same; and a semiconductor device which contains the porous film inside.

2. Description of the Related Art

In the fabrication of semiconductor integrated circuits, as the circuits are packed tighter, an increase in interconnection capacitance, which is a parasitic capacitance between metal interconnections, leads to an increase in interconnection delay time, thereby hindering the enhancement of the performance of semiconductor circuits. The interconnection delay time is called an RC delay which is in proportion to the product of the electric resistance of the metal interconnections and the static capacitance between the interconnections. Reducing the interconnection delay time requires reducing the resistance of metal interconnections or the interconnection capacitance.

The reduction in resistance of the interconnection metal and the interconnection capacitance can prevent a densely packed semiconductor device from causing an interconnection delay, thereby realizing a finer and faster semiconductor device with reduced power consumption.

In an attempt to reduce the resistance of metal interconnections, in recent years, metallic copper interconnections have been employed more than conventional aluminum interconnections in the structure of a semiconductor device. However, use of this structure alone has limits in the enhancement of the performance, so the reduction in interconnection capacitance is an urgent necessity for higher performance of semiconductors.

One method for reducing interconnection capacitance is to reduce the relative permittivity (dielectric constant) of an interlevel insulator film disposed between metal interconnections. As such an insulator film with a low relative permittivity, it has been considered to use a porous film instead of a silicon oxide film which has been used conventionally. A porous film can be said to be the only practical film as a material with a relative permittivity of 2.0 or less, and various methods for forming a porous film have been proposed.

A first method for forming a porous film is as follows: a precursor solution of a siloxane polymer containing a thermally unstable organic component is synthesized; then the precursor solution is applied on the substrate to form a coating film; and later, a heat treatment is applied to decompose and volatilize the organic component. The result is a number of micro-pores formed in the film.

As a second method for forming a porous film, it is well known to carry out processing as follows: a silica sol solution is applied onto a substrate by coating or using a CVD method so as to form a wet gel; and then the silica sol is subjected to a condensation reaction while restricting volume reduction by controlling the speed of the evaporation of the solvent from the wet gel.

As a third method for forming a porous film, it is well known that a silica micro-particle solution is applied on a substrate to form a coating film, and then the coating film is sintered to form a number of micro-pores between silica micro-particles.

As a fourth method, Japanese Patent Provisional Publication No. 2000-44875 proposes a composition for porous film formation which is characterized by containing a compound having (A) a component expressed by $(R')_m Si(OR'')_{4-n}$ (R' and R'' are univalent organic radicals, and m is an integer of 0 to 2); (B) a metal chelate compound; and (C) a compound having a polyalkylene oxide structure.

However, these methods have respective major drawbacks as follows.

In the first method for forming a porous film, the synthesis of the precursor solution of the siloxane polymer increases the cost. In addition, the formation of the coating film by coating the precursor solution increases the amount of silanol groups remaining in the coating film, which causes a degassing phenomenon indicating the evaporation of water and the like in the heat treatment process that is conducted later and which also deteriorates the film quality due to the porous film absorbing humidity.

In the second method for forming a porous film, the speed control of the evaporation of the solvent from the wet gel requires a special type of coating device, which increases the cost. In addition, a significant amount of silanol remains on the surface of the micro-pores which must be silanized because otherwise hygroscopicity is high and the film quality decreases. The silanization makes the process more complicated. In the case where a wet gel is formed by the CVD process, it is necessary to use a special type of CVD device which is different from the plasma CVD device generally used in the semiconductor process, thereby also increasing the cost.

In the third method for forming a porous film, the diameter of the micro-pores formed between the silica micro-particles, which is determined by the accumulation structure of the silica micro-particles that are accumulated geometrically, becomes very large. This makes it difficult to set the relative permittivity of the porous film to 2 or below.

In the case of the fourth method, out of the three components (A), (B), and (C), the metal chelate compound of (B) is essential to increase the compatibility of the components (A) and (C), and to make the thickness of the coating film uniform after being hardened. However, it is not preferable because it makes the manufacturing process complicated and increases the cost. Therefore, it is desired to develop a material which enables a homogeneous solution to be formed without a chelate component and the coating film to be flat after being hardened.

In comparison to the conventional method for forming a porous film, it has been found that a porous member having a channel structure of mesopore size (micro-pores with diameters of 2 to 50 nm) can be formed as follows: alumino silicate, silica, or the like is condensed while using a micelle made from a surface active agent as a mold so as to form the structure, and then the surface active agent component is removed by sintering or solvent extraction. For example, Inagaki et al. proposes making polysilicates react in water while using a surface active agent as a mold (J. Chem. Soc. Chem. Commun., p. 680, 1993). Furthermore, Japanese Patent Provisional Publication No. 9-194298 discloses that tetraalkoxysilane is reacted in acid conditions in water while using a surface active agent as a mold, and is applied onto the substrate so as to form a silica porous film having micro-pores of diameters of 1 to 2 nm.

However, these methods have problems as follows. In the first method, the powdered porous member can be easily formed, but it is impossible to form a porous film as a thin film on the substrate which is used for the fabrication of semiconductor devices. In the second method, a porous member can be formed into a thin film, but it is impossible to control the orientation of micro-pores, and it is also impossible to form a uniform thin film in a wide area.

Japanese Patent Provisional Publication No. 2001-130911 discloses a method for forming a silica mesoporous thin film by using a mixture of an acid hydrolysis condensate of a silicon alkoxide and a surface active agent after adjusting the mixture to pH3 or below for stabilization.

However, in this method, too, the restriction of the solute concentration makes it difficult to properly control the thickness of a coating film, thereby making it difficult to apply it to a practical semiconductor fabrication process. When this solution is diluted with water, the thickness of the coating film becomes controllable, but the speed of polycondensation of the silica component increases to lose stability of the coating solution.

On the other hand, use of zeolite as the silicon oxide film has been attempted. For example, in Adv. Mater., 2001, 13, No.10, May 17, p. 746, a zeolite film is prepared by coating tetrapropylammonium hydroxide, tetraethoxysilane, and water onto a silicon wafer and processing them in a sealed container. In addition, according to J. Chem. Soc. Chem. Comm., 1990, p. 755, a seed crystal is coated on a supporting member in an autoclave, and a thin water gel solution is used to make only crystal growth proceed. On the other hand, according to J. Chem. Soc. Chem. Comm., 1990, p. 755, a dry gel is turned into zeolite by a mixed vapor of ethylenediamine, triethylamine and water. Some other methods have been proposed.

However, these methods form a zeolite film in a sealed container such as an autoclave, and are not practically used in a fabrication process for semiconductor devices.

On the other hand, Japanese Patent Provisional Publication Nos. 2001-115029 and 2001-203197 show that a coating solution excellent in dielectric properties is prepared by hydrolysis and condensation of a silane compound. Because it is considered that a coefficient of elasticity must be 5 GPa or higher for use in an actual semiconductor fabrication process, these inventions cannot be said to be satisfactory for mechanical strength.

As described hereinbefore, the conventional porous films have problems wherein the film consistency is low and the thickness is not properly controllable, and as a result, it is difficult even to prepare a coating solution from the material using zeolite. Therefore, when a conventional porous film is integrated into multilayered interconnections of a semiconductor device as an insulator film, the porous film is difficult to be thinned, the film consistency is low, and the film thickness is not properly controllable. These problems decrease the yield of the semiconductor device fabrication or make the fabrication itself difficult. Furthermore, a porous film with a low mechanical strength deteriorates the reliability of the semiconductor device, even if it can be used for semiconductor fabrication.

SUMMARY OF THE INVENTION

The present invention has an object of providing a composition for film formation which can be formed into a porous film that excels in dielectric properties, adhesion, film consistency and mechanical strength, and that is easily thinned; and a porous film and a method for forming the same. The present invention has another object of providing a high-performing and highly reliable semiconductor device which contains the porous film inside.

As a result of keen studies in an attempt to develop a coating solution for forming the aforementioned porous film, the inventors of the present invention have reached a composition for forming a porous film having a mechanical strength and dielectric properties applicable to a semiconductor fabrication process and a method for forming the porous film by adding a zeolite sol which can be prepared in specific conditions to a conventional coating solution for forming a porous film, thereby having realized the present invention.

Zeolite is a general term of crystalline porous aluminosilicates. This crystal not only contains a number of pores having diameters of 0.4 to 0.8 nm or so, but also has an extremely high mechanical strength because of its crystal structure. It is known that the zeolite composed exclusively of silicon is hydrophobic, and its dielectric constant is estimated to be 1.5 to 1.7 or so according to a molecular orbital method. When zeolite micro-particles with such physical properties are added to the composition for coating film formation, the porous film is supplied with excellent mechanical properties and dielectric properties through heat treatment during film formation. These physical properties of zeolite are excellent as a material for a semiconductor porous film.

The zeolite sol used in the present invention contains the above-mentioned zeolite micro-particles; however, alternatively, the sol may be a precursor of a zeolite crystal such as a 3 nm cluster having a crystal lattice of insufficient regularity. The average diameter of the zeolite micro-particles may be preferably 3 to 500 nm. It may not be preferable that the average particle diameter exceeds 500 nm because the porous film to be intended may have a plurality of defects in that case.

In general, source materials to synthesize zeolite include silica source, alumina source, alkali metal hydroxide, and water. The zeolite made from these conventional source materials and by the conventional method contains too many impurities to be used in a semiconductor device. Therefore, it is necessary to prepare pure zeolite containing no impurities such as metal and halogen. For example, there are well-known methods such as in J. Chem. Soc. Chem. Comm., 2000, 2333 and in J. Am. Chem. Soc., 122,3530 (2000). However, these methods are intended to prepare zeolite micro-crystallite and can hardly be said to be suitable for a semiconductor fabrication process.

Hence, the present invention provides a composition for forming a porous film comprising: an amorphous polymer solution which is obtained by hydrolyzing and condensing at least one kind of silane compound expressed by the following general formula (1):

$$(R^1)_n Si(OR^2)_{4-n} \qquad (1)$$

(wherein $R^1$ represents a straight-chain or branched alkyl group or aryl group having 1 to 8 carbons, which can have a substituent, and when there is more than one $R^1$, the $R^1$s can be independent and the same as or different from each other; $R^2$ represents an alkyl group having 1 to 4 carbons, and when there is more than one $R^2$, the $R^2$s can be independent and the same as or different from each other; and n is an integer of 0 to 3);

and a zeolite sol which is formed by using a quaternary ammonium hydroxide. The zeolite sol may be preferably obtained by hydrolyzing a silane compound expressed by the following general formula (2):

$$Si(OR^3)_4 \qquad (2)$$

(wherein $R^3$ represents a straight-chain or branched alkyl group having 1 to 4 carbons, and when there is more than one $R^3$, the $R^3$s can be independent and the same as or different from each other) in the presence of a quaternary ammonium hydroxide and a catalyst, and by heating the silane compound. The present invention also provides a method for forming a porous film comprising:

a coating step for coating this composition for forming a porous film; a subsequent drying step; and a heating step for zeolite structure growth. The present invention further provides a porous film prepared by using this composition for forming a porous film. This porous film can be applied to a semiconductor fabrication process and excels in dielectric properties and mechanical strength.

The present invention further provides a semiconductor device containing a porous film inside which is prepared by using a composition for forming a porous film comprising an amorphous polymer solution that is prepared by hydrolyzing and condensing at least one kind of silane compound expressed by the following formula (1):

$$(R^1)_n Si(OR^2)_{4-n} \qquad (1)$$

(wherein $R^1$ represents a straight-chain or branched alkyl group or aryl group having 1 to 8 carbons, which can have a substituent, and when there is more than one $R^1$, the $R^1$s can be independent and the same as or different from each other; $R^2$ represents an alkyl group having 1 to 4 carbons, and when there is more than one $R^2$, the $R^2$s can be independent and the same as or different from each other; and n is an integer of 0 to 3); and a zeolite sol prepared by using a quaternary ammonium hydroxide. In the semiconductor device of the present invention, the aforementioned porous film is used specifically as an insulator film in multilayered interconnections.

The zeolite sol may be preferably a zeolite sol having an average particle diameter of 3 to 500 nm which is obtained by hydrolyzing a silane compound expressed by the following general formula (2):

$$Si(OR^3)_4 \qquad (2)$$

(wherein $R^3$ represents a straight-chain or branched alkyl group having 1 to 4 carbons, and when there is more than one $R^3$, the $R^3$s can be independent and the same as or different from each other) in the presence of a quaternary ammonium hydroxide and a catalyst, and by heating the silane compound.

The quaternary ammonium hydroxide is preferably one or more compounds expressed by the following general formula (3):

$$(R^4)_4 N^+ OH^- \qquad (3)$$

wherein $R^4$ represents a straight-chain or branched alkyl group having 1 to 20 carbons, and can be independent and the same as or different from each other.

This realizes a semiconductor device which contains a porous film having high film consistency, a low dielectric constant, and mechanical strength sufficient for the fabrication of semiconductor devices as an insulator film of the multilayered interconnections. The proper control of the thickness of the porous film facilitates the fabrication of the semiconductor. Since the zeolite-containing film is an insulator film with a low dielectric constant, the parasitic capacitance around the multilayered interconnections is reduced, thereby achieving high-speed and low-power operations of the semiconductor device.

In the semiconductor device of the present invention, the porous film may be preferably present in an insulator film between metal interconnections in the same layer of the multilayered interconnections or in the interlevel insulator film between the vertically stacked metal interconnection layers. This arrangement can achieve a high-performing and highly reliable semiconductor device.

The use of the composition for forming a porous film of the present invention facilitates the formation of a porous film having a properly controlled thickness. This porous film has a low dielectric constant, and excels in adhesion, film consistency, and mechanical strength. In addition, the use of the porous film made from the composition of the present invention as the insulator film of the multilayered interconnections can achieve a high-performing and highly reliable semiconductor device.

DETAILED DESCRIPTION OF THE PREFERRED EMBODIMENTS

Figure 1:
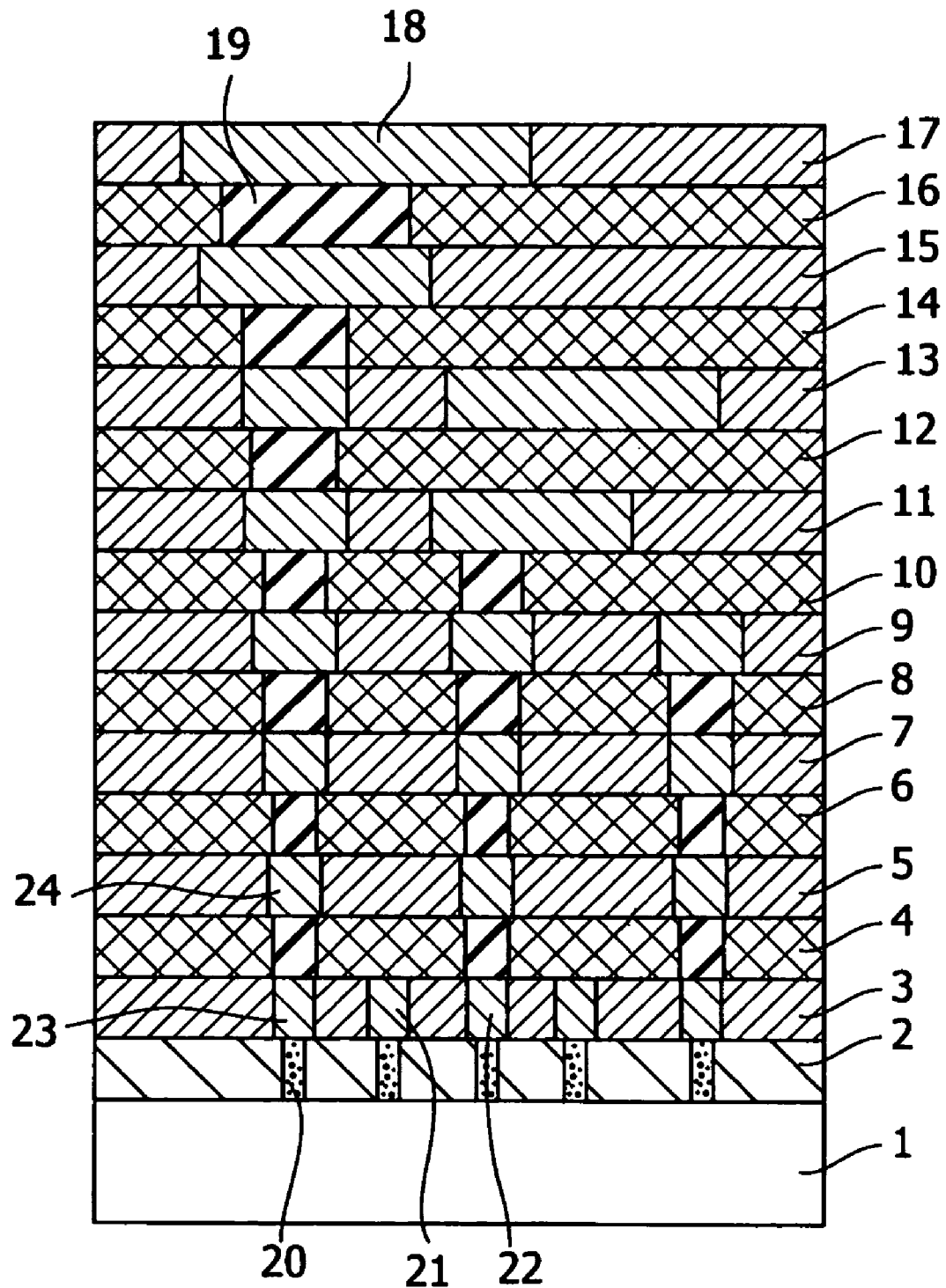
FIG. 1 is an overall cross-sectional view of a semiconductor device of the present invention.

Silane compounds used in the present invention are expressed by the general formula (1). In the formula (1), $R^1$ represents a straight-chain or branched alkyl group or aryl group having 1 to 8 carbons, and may have a substituent. The substituent can include a methyl group, an ethyl group, a propyl group, an isopropyl group, a butyl group, an isobutyl group, a sec-butyl group, a tert-butyl group, a pentyl group, a sec-pentyl group, a neopentyl group, a hexyl group, a 2-ethylhexyl group, a heptyl group, an octyl group, a phenyl group, an o-tolyl group, an m-tolyl group, a p-tolyl group, a xylyl group and a benzil group.

In the general formula (1), $R^2$ represents an alkyl group having 1 to 4 carbons. The alkyl group can include a methyl group, an ethyl group, a propyl group, an isopropyl group and a butyl group. In the general formula (1), n is an integer of 0 to 3.

The silane compounds in the general formula (1) may include, but not limited to, tetramethoxysilane, tetraethoxysilane, tetrapropoxysilane, tetrabutoxysilane, methyltrimethoxysilane, methyltriethoxysilane, methyltripropoxysilane, ethyltrimethoxysilane, propyltrimethoxysilane, butyltrimethoxysilane, pentyltrimethoxy silane, hexyltrimethoxysilane, 2-ethylhexyltrimethoxysilane, phenyltrimethoxysilane, dimethyldimethoxysilane, dimethyldiethoxysilane, trimethylmethoxysilane, triethylmethoxysilane and butyldimethylmethoxysilane.

A silane compound may be hydrolyzed and condensed to form a polymer solution. This hydrolysis and condensation reaction may be preferably performed in the presence of water under acidic condition while using acid as a catalyst so as to form a polymer solution. The acid used for the catalyst can include an inorganic acid such as a hydrochloric acid, a sulfuric acid, or a nitric acid; a sulfonic acid such as a methanesulfonic acid, a benzenesulfonic acid, a p-toluenesulfonic acid, or a trifluoromethanesulfonic acid; an organic acid such as a formic acid, an acetic acid, a propionic acid, an oxalic acid, a malonic acid, a fumaric acid, a maleic acid, a tartaric acid, a citric acid, or a malic acid; and a phosphoric acid. The amount of acid catalyst to be added may be preferably 0.001 to 10 times and more preferably 0.01 to 1.0 times as much as that of a silane compound in a mole ratio. The amount of water for the hydrolysis may be 0.5 to 100 times and more preferably 1 to 10 times as much as the mol number necessary for the complete hydrolysis of the silane compound.

The synthesis of the polymer solution can be performed under an alkali condition, and the base used in this case can include ammonia, amines such as methylamine, ethylamine, n-propylamine, isopropylamine, n-butylamine, dimethylamine, diethylamine, di-n-propylamine, diisopropylamine, trimethylamine, triethylamine, tri-n-propylamine, tri-n-butylamine, triethanolamine, pyrrolidine, piperidine, morpholine, aniline, dimethylaniline, pyridine and dimethylaminopyridines; and alkali metal hydroxides and alkaline-earth metal hydroxides such as sodium hydroxide, potassium hydroxide and calcium hydroxide. The amount of basic catalyst to be added may be preferably 0.001 to 10 times and more preferably 0.01 to 1.0 times as much as that of the silane compound in a mole ratio.

In the case where a silane compound expressed by the general formula (1) is hydrolyzed and condensed to form a polymer solution, it is possible to contain a solvent such as alcohol corresponding to the alkoxy group of the silane compound besides water. The alcohol can include methanol, ethanol, isopropyl alcohol, butanol, propylene glycol monomethyl ether, propylene glycol monopropyl ether, propylene glycol monopropyl ether acetate, ethyl lactate and cyclohexanone. The amount of solvent to be added other than water may be preferably 0.1 to 500 times and more preferably 1 to 100 times in weight as much as that of the silane compound.

The hydrolysis and condensation reactions of these silanes are performed under conditions that are used in the ordinary hydrolysis and condensation reactions, and the reaction temperature may be in the range from 0° C. to the boiling point of alcohol which is generated by the hydrolysis and condensation reactions, and preferably between room temperature and 60° C.

The reaction time is not particularly restricted; however, it may be generally from 10 minutes to 18 hours, and more preferably from 30 minutes to 3 hours or so.

The polymer obtained from a silane compound expressed by the general formula (1) may have a weight average molecular weight of 500 to 50,000,000 on basis of polystyrene when a gel permeation chromatography (GPC) is used.

In the present invention, the zeolite sol having an average particle diameter of 3 to 500 nm which is added to the solution containing the amorphous polymer of a silane compound can be obtained preferably as follows.

A silane compound, which is expressed by the general formula (2) shown below:

$$Si(OR^3)_4 \qquad (2)$$

(wherein $R^3$ represents a straight-chain or branched alkyl group having 1 to 4 carbons, and when there is more than one $R^3$, the $R^3$s can be independent and the same as or different from each other), is used as a structure-directing agent; is hydrolyzed in the presence of a catalyst and the quaternary ammonium hydroxide expressed by a general formula (3) shown below:

$$(R^4)_4N^+OH^- \qquad (3)$$

(wherein $R^4$ represents a straight-chain or branched alkyl group having 1 to 20 carbons, and can be independent and the same as or different from each other); and is heated to yield the zeolite sol.

A silane compound expressed by the general formula (2) may be preferably a compound containing a straight-chain alkyl group having 1 to 4 carbons, and the silane compound can include, but not limited to, tetramethoxysilane, tetraethoxysilane, tetrapropoxysilane, tetrabutoxysilane, triethoxymethoxysilane and tripropoxymethoxysilane.

The quaternary ammonium hydroxide to be added has an important role to determine the crystal type of zeolite, which is generally known as a structure-directing agent. This ammonium hydroxide may be more preferably a compound containing a straight-chain alkyl group having 1 to 4 carbons, and can include, but not limited to, tetramethylammonium hydroxide, tetraethylammonium hydroxide, tetrapropylammonium hydroxide, tetrabutylammonium hydroxide, triethylmethylammonium hydroxide, tripropylmethylammonium hydroxide and tributylmethylammonium hydroxide. The amount of ammonium hydroxide to be added may be preferably 0.1 to 20 times and more preferably 0.5 to 10 times in a mole ratio as much as that of the silane compound expressed by the formula (2).

As the hydrolysis catalyst, general basic catalysts can be used. These basic catalysts include ammonia, amines such as ethylamine, propylamines, diisopropylamine, triethylamine and triethanolamine; quaternary ammonium hydroxides such as tetramethylammonium hydroxides, tetraethylammonium hydroxides, tetrapropylammonium hydroxides and tetrabutylammonium hydroxides; and alkali metal hydroxides and alkaline-earth metal hydroxides such as sodium hydroxides, potassium hydroxides and calcium hydroxides. The amount of basic catalyst to be added may be preferably 0.001 to 10 times and more preferably 0.01 to 1.0 times in a mole ratio as much as that of the silane compound. The amount of water for the hydrolysis may be 0.5 to 100 times and more preferably 1 to 10 times as much as the mol number necessary for the complete hydrolysis of the silane compound.

In the case where a silane compound expressed by the general formula (2) is hydrolyzed to form a zeolite-sol, it is possible to contain a solvent such as alcohol corresponding to the alkoxy group of the silane compound besides water. The alcohol can include methanol, ethanol, isopropyl alcohol, butanol, propylene glycol monomethyl ether, propylene glycol monopropyl ether, propylene glycol monopropyl ether acetate, ethyl lactate and cyclohexanone. The amount of solvent to be added other than water may be preferably 0.1 to 10 times and more preferably 0.5 to 2 times in weight as much as that of the silane compound.

The hydrolysis time of a silane compound of the general formula (2) may be preferably 1 to 100 hours, more preferably 10 to 70 hours, and the temperature may be preferably 0° C. to 50° C., and more preferably 15° C. to 30° C.

The heat treatment after the hydrolysis may be preferably performed at a temperature of 30° C. or higher, and more preferably at a temperature of 50° C. or higher. In the case where the temperature exceeds the boiling point of the solvent used in the hydrolysis in the atmospheric pressure, the process can be performed in a sealed container. The time of the heat treatment may be preferably 1 to 100 hours, and more preferably 10 to 70 hours.

The zeolite sol thus prepared may be dispersed in a reaction solution such as water or alcohol. It may not be preferable to try to obtain dry zeolite by removing the solvent, because this may cause zeolite micro-particles to have secondary agglomeration and to grow in size, thereby making the surface of the finished porous film uneven. To avoid this, the wet zeolite sol is subjected as it is to a concentration adjustment and mixed with the polymer solution of a silane compound expressed by the general formula (1) so as to obtain the intended composition.

The zeolite thus obtained is expected to have extremely high mechanical strength and excellent dielectric properties because it has a crystal structure, that is, a zeolite structure. Studies on the formation of the zeolite structure are known from S. L. Burkett, M. E. Davis, J. Phys. Chem., 98,4647 (1994); S. L. Burkett, M. E. Davis, Chem. Mater., 7,920 (1995); S. L. Burkett, M. E. Davis, Chem. Mater., 7,1453 (1995); M. E. Davis, S. L. Burkett, Zeolite, 12,33 (1995); Kazuo Ono, Tateaki Yashima, "Zeoraito no Kagaku to Kougaku (The Science and Technology of Zeolite)," Kodansha (2000); and the like. The zeolite structure which is referred to in the present invention includes not only zeolite crystal having a long distance regulation as a crystal structure and zeolite having particle diameters of 10 to 15 mm or more but also 3 nm clusters having insufficient regularity of the crystal lattice and the precursor of the zeolite crystal of 10 to 15 nm or so. This precursor repeats agglomeration and crystal growth until the zeolite structure is formed. In this process, the formation of zeolite having various particle diameters is possible; however, the particle diameter has to be controlled because it may affect the porous film. In the present invention, the particle diameter can be controlled by the type, concentration, reaction temperature and other conditions of the catalyst. The average particle diameter of the zeolite may be preferably not more than 500 nm and more preferably not more than 300 nm to achieve the intended mechanical strength of the porous film. It may not be preferable that the average particle diameter exceeds 500 nm because it may cause a number of defects in the intended porous film.

In the present invention, even the zeolite precursor having, an average particle diameter of preferable 3 to 10 nm, more preferable 3 to 15 nm can form zeolite inside the coating film by heat treatment during the formation of porous film in the same manner as the micro-particles which already have the zeolite structure and an average diameter of not less than 10–15 nm, thereby improving the mechanical strength and dielectric properties of the intended porous film. This zeolite structure is a crystal structure with a homogeneous micro-porous structure, which provides excellent mechanical strength in spite of the high rate of pore distribution throughout the formed thin film. A combination of the porosity of the zeolite and the low relative permittivity due to its inherent hydrophobic characteristic makes it possible to obtain a porous film having dielectric properties which is applicable to the semiconductor fabrication process.

In contrast, in the case of silica aerosol and wet colloidal silica that are readily available, since the micro-structure of the silica is amorphous, not only does it have a low mechanical strength but also the particles themselves do not have micro-pores. This is because particles are already formed in silica aerosol and wet colloidal silica, and no zeolite is formed by mixing these particles with a quaternary ammonium hydroxide and then heating the mixture. In order that zeolite is formed, a quaternary ammonium hydroxide is used as the hydrolysis catalyst. This salt will lead silicate ions to the zeolite structure. Therefore, the coating film made from silica aerosol or wet colloidal silica is low in mechanical strength and dielectric properties.

The zeolite sol thus prepared can be dispersed homogeneously by being added to the polymer solution of a silane compound and stirred; however, the maximum amount to be dissolved homogeneously may differ depending on the particle diameter and hydrophobic characteristic of the zeolite sol. Therefore, the amount to be added may change with the type of material. The amount of zeolite to be added in the zeolite sol may be preferably 0.01 to 1.0 parts by weight and more preferably 0.05 to 0.7 parts by weight per 1 part by weight of a silane compound expressed by the general formula (1). When the amount of zeolite added is too little, the mechanical strength and dielectric properties of the thin film may not improve. On the other hand, adding too much zeolite my not be preferable because it may damage the surface of the thin film and increase film defects.

Two or more kinds of zeolite sol having different average particle diameters may be combined as necessary. The ratio between them can be determined properly depending on the physical properties of zeolite sol and the physical properties of the intended porous film.

In the case of these compositions, the thin film with a desired thickness can be obtained by controlling the concentration of the solute and performing spin coating at an appropriate number of revolutions. The actual film thickness may be set to 0.2 to 1 μm or so, but the thickness may not be limited to this range. For example, thicker films can be formed by coating more than one time. In this case, the solvent used for dilution can include an aliphatic hydrocarbon solvent such as n-pentane, isopentane, n-hexane, isohexane, n-heptane, 2,2,2-trimethyl pentane, n-octane, isooctane, cyclohexane or methylcyclohexane; an aromatic hydrocarbon solvent such as benzene, toluene, xylene, ethylbenzene, trimethylbenzene, methylethylbenzene, n-propylbenzene, isopropylbenzene, diethylbenzene, isobutylbenzene, triethylbenzene, diisopropylbenzene or n-amylnaphthalene; a ketone solvent such as acetone, methyl ethyl ketone, methyl n-propyl ketone, methyl n-butyl ketone, methyl isobutyl ketone, cyclohexanone, 2-hexanone, methyl cyclohexanone, 2,4-pentanedione, acetonylacetone, diacetone alcohol, acetophenone or fenthion; an ether solvent such as ethyl ether, isopropyl ether, n-butyl ether, n-hexyl ether, 2-ethylhexyl ether, dioxolane, 4-methyl dioxolane, dioxane, dimethyl dioxane, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol dimethyl ether, diethylene glycol monoethyl ether, diethylene glycol diethyl ether, diethylene glycol monopropyl ether, diethylene glycol dipropyl ether, diethylene glycol monobutyl ether, diethylene glycol dibutyl ether, tetrahydrofuran, 2-methyl tetrahydrofuran, propylene glycol monomethyl ether, propylene glycol dimethyl ether, propylene glycol monoethyl ether, propylene glycol diethyl ether, propylene glycol monopropyl ether, propylene glycol dipropyl ether, propylene glycol monobutyl ether, dipropylene glycol dimethyl ether, dipropylene glycol diethyl ether, dipropylene glycol dipropyl ether or dipropylene glycol dibutyl ether; an ester solvent such as diethyl carbonate, ethyl acetate, γ-butyrolactone, γ-valerolactone, n-propyl acetate, isopropyl acetate, n-butyl acetate, isobutyl acetate, sec-butyl acetate, n-pentyl acetate, 3-methoxybutyl acetate, methylpentyl acetate, 2-ethylbutyl acetate, 2-ethylhexyl acetate, benzil acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, dipropylene glycol monomethyl ether acetate, dipropylene glycol monoethyl ether acetate, dipropylene glycol mono-n-butyl ether acetate, glycol diacetate, methoxy glycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate or diethyl phthalate; a nitrogen-containing solvent such as N-methylformamide, N,N-dimethylformamide, acetamide, N-methylacetamide, N,N-dimethylacetamide, N-methylpropioneamide or N-methylpyrrolidone; or a sulfur-containing solvent such as dimethyl sulfide, diethyl sulfide, thiophene, tetrahydro thiophene, dimethyl sulfoxide sulfolane or 1,3-propanesultone. These materials can be used solely or by mixing two or more thereof.

Although the degree of dilution may depend on the viscosity and intended film thickness, the dilution degree may be generally-so determined that the solvent can be 50 to 99 wt %, and preferably 75 to 95 wt %.

The thin film thus prepared may be heated preferably for several minutes at 50° C. to 150° C. in a drying process (generally called a pre-bake in the semiconductor process) in an attempt to remove the solvent. After the drying process, a heating process for zeolite structure growth is provided in order to stimulate the establishment of the zeolite structure inside the coating film by using the added zeolite sol as the nucleus. In the heating process for the zeolite structure growth, the film is heated preferably to 150° C. to 400° C., and more preferably to 180° C. to 250° C. The heating time is preferably 1 to 300 minutes, and more preferably 1 to 100 minutes. The prepared thin film has excellent mechanical strength because zeolite having high mechanical strength is uniformly distributed throughout the film. The hardness measured by nano indentation is usually 0.7 to 5 GPa, and a coefficient of elasticity of 5 to 40 GPa or so. This indicates that the obtained thin film has much higher mechanical strength than the case of using the porous material in which pores are generated by adding a thermally decomposed polymer to silicone resin and removing the polymer by heating it, and the porous material only exhibits a hardness of 0.05 to 2 GPa and a coefficient of elasticity of 1.0 to 4.0 GPa.

The porous film of the present invention is particularly preferable as the interlevel insulator film of the interconnections in a semiconductor integrated circuit. The semiconductor device is required to reduce interconnection capacitance in order to prevent interconnection delay when highly integrated. Various means have been developed to achieve this, and one of them is to reduce the relative permittivity of the interlevel insulator film disposed between metal interconnections. When an interlevel insulator film is prepared by using the composition for forming a porous film of the present invention, the semiconductor device can be finer and faster and consume less power.

There is a conventional problem that when a porous film is prepared by introducing pores in the film so as to lower the dielectric constant, the mechanical strength of the film decreases as the density of the material composing the film decreases. The decrease in mechanical strength not only affects the strength of the semiconductor device itself but also causes exfoliation due to insufficient strength in a chemical mechanical polishing process which is generally used in the fabrication process. Particularly, when used as the interlevel insulator film of a semiconductor, the porous film of the present invention with high mechanical strength and low relative permittivity prevents such exfoliation, thereby making it possible to fabricate a high-speed, highly reliable and downsized semiconductor device.

The embodiments of the semiconductor device of the present invention will be described below. FIG. 1 shows an overall cross-sectional view of an example of the semiconductor device of the present invention.

In FIG. 1, the substrate 1 is an Si semiconductor substrate such as an Si substrate or an SOI (Si-on-insulator) substrate; however, it can be a compound semiconductor substrate such as SiGe or GaAs. The interlevel insulator films include the interlevel insulator film 2 of the contact layer; the interlevel insulator films 3, 5, 7, 9, 11, 13, 15, and 17 of the interconnection layers; and the interlevel insulator films 4, 6, 8, 10, 12, 14, and 16 of the via layers. The interconnection layers corresponding to the lowermost interlevel insulator film 3 through the uppermost insulator film 17 are abbreviated as M1, M2, M3, M4, M5, M6, M7, and M8, respectively. The via layers corresponding to the lowermost interlevel insulator film 4 through the uppermost insulator film 16 are abbreviated as V1, V2, V3, V4, V5, V6, and V7, respectively. Although some of the metal interconnections are referred to with the numbers 18 and 21 to 24, the other regions with the same pattern not labeled with numbers indicate metal interconnections. The via plug 19 is made from a metal. In-the case of copper interconnection, copper is generally used. The regions having the same pattern as the via plug 19 represent via plugs although they are not labeled with numbers in the drawing. The contact plug 20 is connected to the gate of the transistor (not illustrated) formed on the top surface of the substrate 1 or to the substrate. Thus, the interconnection layers and the via layers are alternately stacked, and multilayer interconnections generally indicate M1 and regions higher than M1. In general, M1 to M3 are called local interconnections, M4 and M5 are called intermediate interconnections or semi-global interconnections, and M6 to M8 are called global interconnections.

In the semiconductor device of the present invention, the porous film of the present invention is used as one or more of the interlevel insulator films 3, 5, 7, 9, 11, 13, 15, and 17 of the interconnection layers and the insulator films 4, 6, 8, 10, 12, 14, and 16 of the via layers.

For example, when the porous film of the present invention is used for the interlevel insulator film 3 of the interconnection layer (M1), the interconnection capacitance between the metal interconnection 21 and the metal interconnection 22 can be greatly reduced. When the porous film of the present invention is used for the interlevel insulator film 4 of the via layer (V1), the interconnection capacitance between the metal interconnection 23 and the metal interconnection 24 can be greatly reduced. Using the porous film with a low relative permittivity of the present invention as an interconnection layer can greatly reduce the metal interconnection capacitance in the same layer. On the other hand, using the porous film with a low relative permittivity of the present invention as a via layer can greatly reduce the interlevel capacitance between the vertical metal interconnections. Therefore, using the porous film of the present invention for all of the interconnection layers and the via layers can greatly reduce the parasitic capacitance of the interconnections. Hence, the use of the porous film of the present invention as insulator films of the interconnections prevents a conventional problem, that is, an increase in the dielectric constant resulting from the porous film absorbing humidity while multilayered interconnections are formed by stacking porous films. As a result, the semiconductor device can perform high-speed and low-power operations.

The porous film of the present invention enables a semiconductor device to have higher mechanical strength by its high mechanical strength, thereby greatly improving the yield of the fabrication and the reliability of the semiconductor device.

The present invention will be described specifically through the following examples, but is not restricted to them.

PREPARATION EXAMPLE 1

A mixture of 14.6 g of tetraethoxysilane and 25.4 g of 1 mol/L of aqueous solution of tetrapropylammonium hydroxide was stirred for 3 days at room temperature. Then, the reaction mixture was stirred for 3 days at 80° C. to obtain a zeolite sol having an average particle diameter of 75 nm.

Next, 8 g of aqueous solution of 28 wt % ammonia, 512 g of ultra pure water, 960 g of ethanol, and the aforementioned zeolite sol were mixed at room temperature. Then, 32 g of tetraethoxy silane and 24 g of methyl trimethoxy silane were added to the mixture and stirred for 4 hours at 65° C. Then, 320 g of propylene glycol monopropyl ether was added to the obtained reaction solution and concentrated until the weight of the solution reached 320 g to obtain a composition solution for coating.

Determination of the Zeolite Structure

After having been powdered by vacuum drying, the zeolite sol was studied by using an X-ray diffraction device: M18XHF-SRA (from MAC Science co., Ltd.).

Measurement of Zeolite Particle Diameter

The zeolite particle diameter was measured by a laser scattering method, by using a submicron particle size analyzer: N4 Plus (from Coulter, Inc.).

PREPARATION EXAMPLE 2

Another composition solution for coating was prepared in the same manner as in Preparation Example 1 except that 32.4 g of 1 mol/L of aqueous solution of tetrabutylammonium hydroxide was used instead of 25.4 g of 1 mol/L of aqueous solution of tetrapropylammonium hydroxide.

PREPARATION EXAMPLE 3

Another composition solution for coating was prepared in the same manner as in Preparation Example 1 except that 32 g of tetramethoxysilane was used instead of 32 g of tetraethoxysilane.

PREPARATION EXAMPLE 4

A mixture of 69 g of tetramethoxysilane and 66 g of methanol was dropped over 1 hour at 40° C. into a mixture of 41 g of 28 wt % by weight aqueous ammonia solution, 30 g of ultra pure water, 430 g of methanol, and 163 g of 1 mol/L of aqueous solution of tetrapropylammonium hydroxide. The resultant solution was concentrated at 40° C. to 45° C., and the reaction mixture was stirred for 3 days at 70° C. so as to obtain a zeolite sol having a particle diameter of 3 nm.

After mixing 8 g of 28 wt % by weight aqueous ammonia solution, 512 g of ultra pure water, 960 g of ethanol, and the aforementioned zeolite sol on room temperature, 32 g of tetraethoxy silane and 24 g of methyltrimethoxysilane were added thereto and stirred for. 4 hours at 65° C. Then, 320 g of propylene glycol monopropyl ether was added to the obtained reaction solution and was concentrated until the weight of the solution reached 320 g, thereby obtaining a composition solution for coating.

PREPARATION EXAMPLE 5

The 3 g of the zeolite sol obtained in Preparation Example 1 was added to 50 g of the composition obtained in Preparation Example 4 so as to form a composition for coating.

COMPARATIVE PREPARATION EXAMPLE 1

A composition solution for coating was prepared in the same manner as in Preparation Example 1 except that 8 g of Snowtex ST-YL (from Nissan Chemical Industries, LTD.) was used instead of the zeolite sol.

COMPARATIVE PREPARATION EXAMPLE 2

Another composition solution for coating was prepared in the same manner as in Preparation Example 1 except that no zeolite sol was added.

EXAMPLE 1

The solution of Preparation Example 1 was spin-coated for 1 minute at 4000 rpm by using a spin coater so as to form a film on an 8-inch wafer. This film had a thickness of 8000 Å when heated for 2 minutes at 120° C. by using a hot plate. The film was further heated for 3 minutes at 250° C. And then the film was heated for 1 hour at 450° C. in an atmosphere of nitrogen by using a clean oven. The thickness at this moment was 7,200 Å. The coating film thus formed had a relative permittivity of 2.2 and a coefficient of elasticity of 6.5 GPa.

Physical Properties Measurement Method

Relative Permittivity

Relative permittivity was measured by a CV method with an automatic mercury probe by using an automatic mercury CV analyzer: 495 CV Measurement System (from SSM Japan).

Coefficient of Elasticity

Coefficient elasticity was measured by using a nano indicator (from Nano Instruments, Inc.).

EXAMPLES 2 TO 5

Thin films were prepared by using the respective solutions in Preparation Examples 2 to 5 as coating solutions and processed in the same manner as in Example 1. The relative permittivities and coefficients of elasticity thereof are shown in Table 1 below.

COMPARATIVE EXAMPLES 1 TO 2

Thin films were prepared by using the respective solutions in Comparative Preparation Examples 1 to 2 as coating solutions and processed in the same manner as in Example 1. The relative permittivities and coefficients of elasticity thereof are shown in Table 1 below.

TABLE 1

| | Relative permittivity | Coefficient of elasticity/GPa |
|---|---|---|
| Example 1 | 2.2 | 6.5 |
| Example 2 | 2.2 | 5.9 |
| Example 3 | 2.2 | 6.1 |
| Example 4 | 2.1 | 5.5 |
| Example 5 | 2.1 | 6.5 |
| Comparative Example 1 | 2.8 | 3.9 |
| Comparative Example 2 | 2.2 | 2.1 |

What is claimed is:

1. A composition for forming a porous film comprising:
an amorphous polymer solution obtained by hydrolyzing and condensing at least one silane compound expressed by formula (1):

$$(R^1)_n Si(OR^2)_{4-n} \quad (1)$$

wherein $R^1$ represents a straight-chain or branched alkyl group or aryl group having 1 to 8 carbons, which can have a substituent, and when there is more than one $R^1$, the $R^1$s can be independent and the same as or different from each other; $R^2$ represents an alkyl group having 1 to 4 carbons, and when there is more than one $R^2$, the $R^2$s can be independent and the same as or different from each other; and n is an integer of 0 to 3; and
a zeolite sol formed by a method comprising:
hydrolyzing, in the presence of a quaternary ammonium hydroxide, a silane compound expressed by formula (2):

$$Si(OR^3)_4 \quad (2)$$

wherein $R^3$ represents a straight-chain or branched alkyl group having 1 to 4 carbons, and can be independent and the same as or different than each other; and
heating said silane compound after hydrolyzing said silane compound, and wherein said composition is suitable for coating.

2. A semiconductor device comprising a porous film inside which is prepared by using the composition of claim 1.

3. The composition according to claim 1, wherein said zeolite sol has an average particle diameter of 3 nm to 500 nm.

4. The composition according to claim 3, wherein said quaternary ammonium hydroxide is one or more compounds expressed by formula (3):

$$(R^4)_4 N^+ OH^- \quad (3)$$

wherein $R^4$ represents a straight-chain or branched alkyl group having 1 to 20 carbons, and can be independent and the same as or different from each other.

5. A method for forming a porous film comprising:
a coating step for coating the composition according to claim 3;
a subsequent drying step; and
a heating step for zeolite structure growth.

6. A porous film prepared by using the composition according to claim 3.

7. An insulator film prepared by using the composition according to claim 3.

8. A semiconductor device comprising a porous film inside which is prepared by using the composition according to claim 3.

9. A semiconductor device comprising a porous film inside which is prepared by using the composition according to claim 4.

10. A composition for forming a porous film comprising:
an amorphous polymer solution obtained by hydrolyzing and condensing at least one silane compound expressed by formula (1):

$$(R^1)_n Si(OR^2)_{4-n} \quad (1)$$

wherein $R^1$ represents a straight-chain or branched alkyl group or aryl group having 1 to 8 carbons, which can have a substituent, and when there is more than one $R^1$, the $R^1$s can be independent and the same as or different from each other; $R^2$ represents an alkyl group having 1 to 4 carbons, and when there is more than one $R^2$, the $R^2$s can be independent and the same as or different from each other; and n is an integer of 0 to 3; and
a zeolite sol formed by a method comprising:
hydrolyzing, in the presence of a catalyst and a quaternary ammonium hydroxide, a silane compound expressed by formula (2):

$$Si(OR^3)_4 \quad (2)$$

wherein $R^3$ represents a straight-chain or branched alkyl group having 1 to 4 carbons, and can be independent and the same as or different than each other; and
heating said silane compound after hydrolyzing said silane compound,
wherein said zeolite sol has an average particle size of 3 nm to 500 nm, and wherein said composition is suitable for coating.

11. The composition according to claim 10, wherein said quaternary ammonium hydroxide is one or more compounds expressed by formula (3):

$$(R^4)_4 N^+ OH^- \quad (3)$$

wherein $R^4$ represents a straight-chain or branched alkyl group having 1 to 20 carbons, and can be independent and the same as or different from each other.

12. A method for forming a porous film comprising:
a coating step for coating the composition according to claim 10;
a subsequent drying step; and
a heating step for zeolite structure growth.

13. A porous film prepared by using the composition according to claim 10.

14. An insulator film prepared by using the composition according to claim 10.

15. A semiconductor device comprising a porous film inside which is prepared by using the composition of claim 10.

16. The semiconductor device of claim 15, wherein said quaternary ammonium hydroxide is one or more compounds expressed by formula (3):

$$(R^4)_4 N^+ OH^- \quad (3)$$

wherein $R^4$ represents a straight-chain or branched alkyl group having 1 to 20 carbons, and can be independent and the same as or different from each other.

* * * * *